United States Patent [19]
Nisiyama et al.

[11] Patent Number: 5,763,880
[45] Date of Patent: Jun. 9, 1998

[54] CATHODE, ELECTRON BEAM EMISSION APPARATUS USING THE SAME, AND METHOD OF MANUFACTURING THE CATHODE

[75] Inventors: Hidetoshi Nisiyama, Kodaira; Masakuni Okamoto, Kokubunji; Hiroyuki Shinada, Chofu; Katsuhiro Kuroda, Hachioji, all of Japan

[73] Assignee: Hitachi, Ltd., Tokyo, Japan

[21] Appl. No.: 610,489

[22] Filed: Mar. 4, 1996

[30] Foreign Application Priority Data

Mar. 14, 1995 [JP] Japan ................... 7-054380

[51] Int. Cl.$^6$ ................... H01J 3/02
[52] U.S. Cl. ............ 250/310; 250/423 F; 313/336; 313/346 R
[58] Field of Search ............... 250/310, 311, 250/423 F, 492.3, 423 R; 313/310, 311, 336, 346 R

[56] References Cited

U.S. PATENT DOCUMENTS

| | | | |
|---|---|---|---|
| 3,273,005 | 9/1966 | Lafferty | 313/336 |
| 3,814,975 | 6/1974 | Wolfe et al. | 313/336 |
| 4,324,999 | 4/1982 | Wolfe | 313/336 |
| 4,379,250 | 4/1983 | Hosoki et al. | 313/336 |
| 4,438,371 | 3/1984 | Hosoki et al. | 250/423 F |
| 5,440,124 | 8/1995 | Kelly et al. | 250/423 F |
| 5,536,944 | 7/1996 | Tsunoda et al. | 250/423 F |
| 5,616,926 | 4/1997 | Shinada et al. | 250/423 F |

FOREIGN PATENT DOCUMENTS

| | | |
|---|---|---|
| 0696043A1 | 8/1995 | European Pat. Off. |
| 56-61734 | 5/1981 | Japan |
| 59-49065 | 3/1984 | Japan |

OTHER PUBLICATIONS

Patent Abstracts of Japan, vol. 018, No. 332, Jun. 23, 1994.

*Primary Examiner*—Kiet T. Nguyen
*Attorney, Agent, or Firm*—Antonelli, Terry, Stout & Kraus, LLP

[57] ABSTRACT

A cathode (e.g., a Schottky emission cathode) having an electron emitter of a tungsten single-crystal with a sharp point, and a heater connected to the electron emitter to heat it. The work function of the crystal face of the point of the electron emitter is reduced by providing adsorbed thereon a nitride of Zr, Ti, Y, Nb, Sc, V or La, or an oxide of Y, Sc, V or La. The nitride or oxide can be formed as a reservoir on the heater (from where it thermally diffuses to the point), or chemically adsorbed on the point. For forming the nitride or oxide on the point, the metal forming the nitride or oxide can be provided on the point and reacted with nitrogen or oxygen thereat to form the nitride or oxide; to provide the metal on the point, the metal forming the nitride or oxide can either be evaporated onto the point, or can form a reservoir on the heater and thermally diffuse therefrom to the point. The effect of reducing the work function results in a cathode having a narrow FWHM (full width at half maximum) of emission electrons and a high current density.

46 Claims, 4 Drawing Sheets

CATHODE, ELECTRON BEAM EMISSION APPARATUS USING THE SAME, AND METHOD OF MANUFACTURING THE CATHODE

BACKGROUND OF THE INVENTION

The present invention relates to a cathode (e.g., Schottky emission cathode) fit for use in electron-beam application apparatus for measuring and processing purposes by making use of electron beams. In particular, the present invention is directed to such cathode useful in apparatus such as transmission electron microscopes, scanning electron microscopes, and electron beam lithography systems requiring high current density and narrow FWHM (Full Width at Half Maximum); and the apparatus using such cathode.

Previously, $LaB_6$ thermal emission cathodes and W<310> field emission cathodes have been chiefly employed as the cathodes of electron-beam application apparatus such as transmission electron microscopes, scanning electron microscopes, electron beam lithography systems and the like. However, a cathode called a diffusively supply type has increasingly replaced the $LaB_6$ thermal emission cathode and the W<310> field emission cathode in recent years, partly because the diffusively supply type cathode provides a brightness higher than what is offered by the $LaB_6$ thermal emission cathode and party because the diffusively supply type cathode is easy to handle and is able to make a stable electron emission available as compared with the W<310> field emission cathode. The diffusively supply type cathode is such that zirconium or titanium and oxygen are supplied to the leading end portion of a needle-shaped tungsten (W single-crystal <100>) chip by means of thermal diffusion to form an adsorption layer with a low work function in the point thereof (see Japanese Patent Laid-Open No. 49065/1984).

There is also known a cathode formed by adsorbing Zr or Ti on the crystal face of the point of the W tip, and thereafter the adsorbed material is reacted with nitrogen gas, a low work function being created on the crystal face (see Japanese Patent Laid-open No. 61734/1981). While the point of the single-crystal chip of the cathode is heated to 1,000°–2,000° K, a strong electric field for drawing out electrons is applied to the point of the single-crystal chip in order to take out not only thermally excited electrons having energy higher than the potential barrier produced by the image force of electrons and the electric field but also electrons transmitting through the potential barrier.

In the case of the aforementioned W<310> field emission cathode, the full width at half maximum (FWHM) of the energy distribution of electrons to be emitted (hereinafter called the "FWHM") is as narrow as approximately 0.3 eV, whereas in the case of the conventional Schottky emission cathode, which uses an oxide, the FWHM is 0.5 eV or greater. The greater the FWHM, the greater is the chromatic aberration, so that the resolving power of an electron microscope using such cathode is reduced. For example, a 16–64 Mbyte DRAM (Dynamic Random Access Memory) has electric lines (circuit lines) with a 0.25– 0.3 µm line width. When one measures the appearance of this DRAM, about 2% precision is required. So the required resolving power of a SEM (Scanning Electron Microscope) is 6 nm (0.3*2%). This resolving power is achieved by the conventional Schottky emission cathode, which used oxide (FWHM is 0.5 eV). However, a 256 M-1 Gbyte DRAM requires electrical lines with a 0.2 µm line width. So the required resolving power of the SEM is 4 nm. This resolving power is achieved by a cathode which has 0.2–0.3 eV of FWHM, as shown in the following Table.

TABLE

| DRAM | 16 M–64 Mbyte | 256 M–1 Gbyte |
|---|---|---|
| line width of the electric line | 0.25–0.3 µm | 0.2 µm |
| required resolving power of the SEM | 6 nm | 4 nm |
| required FWHM of the cathode | 0.5 eV | 0.2–0.3 eV |

Furthermore, an electron beam at low acceleration voltage is used for a scanning electron microscope for evaluating the LSI (large-scale integrated circuit) process, to prevent sample damage and electrification resulting from electron beam irradiation. As the resolving power is proportional to the ratio of acceleration voltage to the FWHM, it is very important that the FWHM of the emitted electron from the cathode be narrow at low acceleration voltages.

SUMMARY OF THE INVENTION

Therefore, an object of the present invention is to provide a cathode (e.g., a Schottky emission cathode) which maintains distinctive features of a Schottky emission cathode and which imparts high brightness, makes stable electron emission available and is easy to handle.

In particular, it is an object of the present invention to provide a cathode capable of making available an electron emission whose FWHM is equal to or narrower than that of the electron emission obtainable from the aforementioned conventional W<310> field emission cathode.

By the way, a conventional Schottky emission cathode which uses a nitride has a narrow FWHM, but is not easy to handle. Therefore, another object to the present invention is ease of handling.

A further object of the present invention is to provide a method of making this cathode.

A still further object of the present invention is to provide an electron beam emission apparatus (e.g., a transmission electron microscope, a scanning electron microscope, electron beam lithography apparatus, etc.) using such cathode.

In order to accomplish the above objects, the adsorbate used in this invention has a work function lower than that of those in conventional Schottky emission cathodes. More specifically, a nitride of zirconium (Zr), titanium (Ti), yttrium (Y), niobium (Nb), scandium (Sc), vanadium (V) or lanthanum (La), or an oxide of yttrium (Y), scandium (Sc), vanadium (V) or lanthanum (La), is used as an adsorbate to be adsorbed on the leading end portion (e.g., sharp point or tip) of a tungsten (W) single-crystal chip. Such an adsorbate is adsorbed on the W (100), (110), (111) or (310) face of the point of a tungsten (W) single-crystal chip.

One of the methods for adsorbing the adsorbate is to heat a reservoir of the aforementioned nitride or oxide deposited on the base of a cathode (e.g., on the heater of the cathode) so as to thermally diffuse the adsorbate to the point of the cathode. Another method of the sort mentioned above is to deposit an adsorbate in the form of a single metal substance onto the base of a cathode so as to thermally diffuse the adsorbate to the point of the cathode; the single metal substance is reacted with nitrogen or oxygen (e.g., on the base or on the point) to form the nitride or oxide. Still another method is to adsorb such a single metal substance by evaporation on the point of a cathode and then to allow the adsorbate to react with nitrogen or oxygen gas to form a nitride or an oxide.

Emission electrons from the Schottky emission cathode are emitted by a combination of an applied electric field and thermal energy. The emission electrons include not only thermally excited electrons having energy higher than the potential barrier produced by the image force of electrons and the electric field, but also include electrons passing through the potential barrier. In order to narrow the FWHM, it is needed to cause Schottky emission electrons to be emitted as the main component in an area where the number of field emission components is small. Since the electrons emitted in the Schottky emission area are those thermally excited, the FWHM is substantially proportional to the heating temperature. Therefore, the heating temperature needs to be lowered in order to attain a narrower FWHM. However, it is not preferred to reduce current density by lowering the heating temperature. What has been searched for is an adsorbate more effective in reducing the work function when the adsorbate is adsorbed on the W chip surface, in comparison with a case where a conventional zirconium or titanium oxide is used as an adsorbate.

The variation of the work function due to the adsorption of atoms on the metal surface is explained by a variation of the space distribution of electron density on the adsorption surface. FIGS. 4(a) and 4(b) show the situation in question. Electrons are caused to move when atoms or molecules 42 are adsorbed on a metal surface 41, and, as shown in FIG. 4(a), electric dipoles p are induced on the surface. The work function tends to decrease when electrons on the surface are drawn in the direction of the inner solid. FIG. 4(b) is a structural drawing of energy, showing the situation above.

The electric dipoles p thus generated by adsorption as shown in FIG. 4(a) lower a vacuum level as shown in FIG. 4(b) and reduce the work function by $\Delta\phi = ePN/2\epsilon_o$, where N=density of adsorption atoms per unit area; $\epsilon_o$ is permittivity in a vacuum; and e=charge. When, moreover, reverse electric dipoles, unlike those shown in FIG. 4(a), are generated, the vacuum energy level (energy level of an electron in free space) is conversely raised and the work function is increased. Thus, variation in the work function can be estimated by evaluating the value of the electric dipole (surface electric dipole) induced on the surface because of the atomic adsorption.

In order to obtain a variation of the work function, the ab initio pseudo potential based on the local spin density functional method was used to calculate the distribution of electrons on the surface, according to the electronic state calculation, by the liner combination atomic orbitals with respect to the electron wave function. The calculation model is intended to adsorb only a single monatomic metal layer via nitrogen or oxygen atoms on the W surface. On the basis of the results obtained from the calculation of the distribution of electrons on the W surface, electric dipoles p on the surface were obtained to estimate a reduction $\Delta\phi$ in the work function. As a result, it was proved that in comparison with a reduction in the work function of the W chip surface when conventionally used zirconium oxide and titanium oxide were used as adsorbates, a reduction in the work function became greater by 0.2–0.6 eV when a nitride of zirconium (Zr), titanium (Ti), yttrium (Y), niobium (Nb), scandium (Sc), vanadium (V) or lanthanum (La), or an oxide of yttrium (Y), scandium (Sc), vanadium (V) or lanthanum (La), was adsorbed as an adsorbate on the W (100), (110), (111) or (310) face on the W chip surface.

Accordingly, by use of the present invention, materials with further reduced (low) work function are provided (adsorbed) at the tip of the cathode, so as to thereby provide a cathode having improved FWHM. Thus, an electron beam emission apparatus (e.g., a scanning electron microscope) having a high resolving power can be provided.

Moreover, according to the present invention a reservoir of the nitride or oxide can be provided on the base (e.g., on the heater) of the cathode. Thus, especially in light thereof, the cathode of the present invention is easy to handle and to use.

DETAILED DESCRIPTION OF THE INVENTION

Figure 1A:
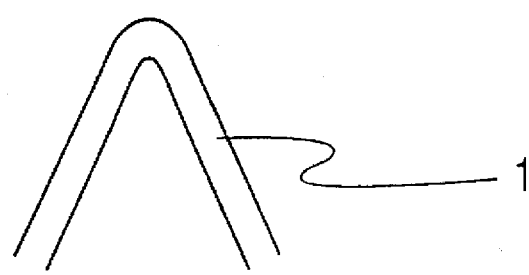
FIGS. 1(a)–(d) are diagrams illustrating a process of producing a cathode according to a first embodiment of the present invention.
Figure 1B:
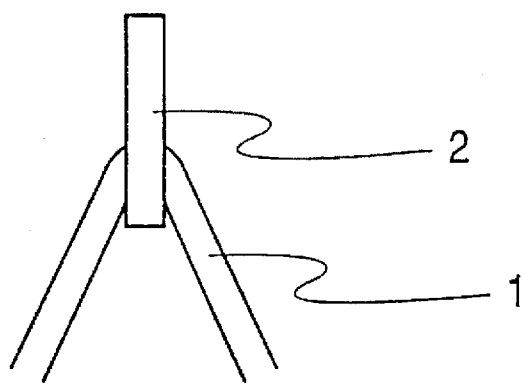
Figure 1C:
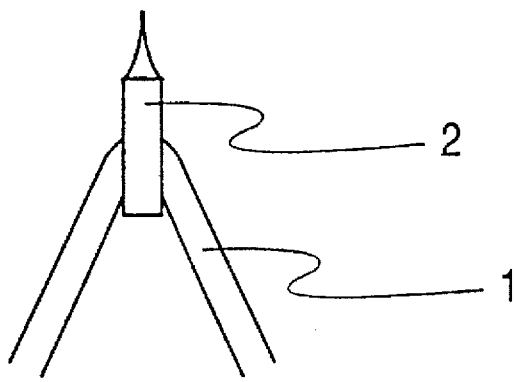
Figure 1D:
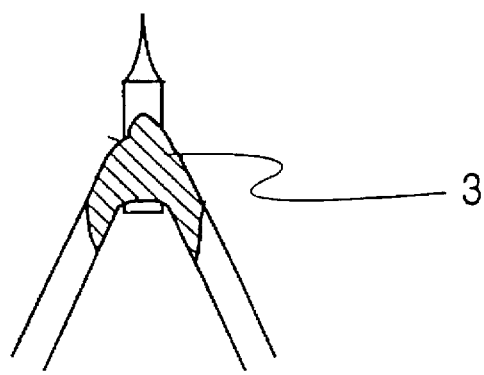

While the present invention will be described in connection with specific and preferred embodiments, it will be understood that it is not intended to limit the invention to those embodiments. To the contrary, it is intended to cover all alterations, modifications and equivalents as may be included within the spirit and scope as defined by the appended claims.

Throughout the present disclosure, where structure and apparatus of the present invention are described as comprising or including specific components, and where processes are described as comprising or including specific process steps, it is contemplated by the inventors that the present invention also consists essentially of, or consists of, the specific components or process steps.

Generally, according to one aspect of the present invention, the cathode of the present invention includes a material of low work function provided on a surface of the tip of the cathode, e.g., on a tungsten, single-crystal chip, this material of low work function being a nitride of a material which has less electronegativity than nitrogen. Illustratively, and not limiting, the nitride can be a nitride of a metal selected from the group consisting of zirconium, titanium, yttrium, niobium, scandium, vanadium and lanthanum.

The nitride can be adsorbed (e.g., chemically adsorbed) on the tip of the cathode. Moreover, the nitride can form a reservoir of material, e.g., on the heater of the cathode, the nitride then being provided at the tip of the cathode by thermal diffusion from the reservoir to the tip. This reservoir can be the metal per se, rather than the nitride; the metal can thermally diffuse to the tip and react with nitrogen to be adsorbed at the tip as the nitride. The metal can be evaporated onto the sharp tip, the nitride being formed by reacting the metal with nitrogen gas.

As another aspect of the present invention, an oxide of a metal selected from the group consisting of yttrium, scandium, vanadium and lanthanum is chemically adsorbed on the tip of the cathode. As discussed previously in connection with the nitrides, a reservoir (e.g., on the heater of the cathode) can include the oxide which thermally diffuses from the reservoir and is chemically adsorbed onto the tip. Also as with the nitrides, the reservoir can be the metal per se, which can be thermally diffused to the tip and reacted with oxygen to form the oxide, e.g., chemically adsorbed at the tip. Moreover, the metal can be evaporated onto the tip, the oxide being formed by reacting the metal with oxygen.

In the foregoing aspects of the present invention using either the nitride or the oxide, the reservoir can include both the nitride and the metal per se, and can include both the oxide and the metal per se.

Embodiment 1

Referring to FIGS. 1(a)–(d), a description will be given of a first embodiment of the present invention. First, an electron emitter 2 is prepared by spot-welding a W <100> single-crystal having a diameter of 0.127 mm to the bend of a V-shaped tungsten (W) wire heater 1 having a diameter of 0.127 mm (FIG. 1(a), (b)), and sharpening the end of the crystal by electrochemical etching in a 5% aqueous solution of sodium hydroxide (FIG. 1(c)), as known in the art. Then powder of an Nb nitride (e.g., NbN) as a reservoir 3 is dissolved in pure water, and the solution is applied to the vicinity of the joint between the heater 1 and the electron emitter 2 (FIG. 1(d)). Further, the heater 1 is energized electrically in a high vacuum at a pressure below $10^{-9}$ Torr to raise the temperature of the electron emitter 2 up to approximately 2,000° K, so that the Nb nitride from the reservoir 3 is deposited on the surface of the point of the electron emitter 2 by thermal diffusion. This reduces the work function of the surface of the point W (100). When the work function of the W (100) surface is calculated according to an electronic state calculation in such a state that the temperature of the electron emitter 2 has been lowered to approximately 1,500° K, then the function becomes 2.0 eV in value. This value is lower by 0.6 eV than the 2.6 eV resulting from using a zirconium oxide as a conventional adsorbate. The distribution of energy of emission electrons thus obtained with an electric field of 0.5 V/nm at the leading end of the electron emitter 2 was calculated according to the free electron model by applying a high voltage between the electron emitter 2 in that state and an anode placed opposite to the point of the electron emitter 2. Then, FWHM=0.2 eV, and an angular intensity=0.5 mA/Sr, were obtained.

When powder of NbN as a reservoir 3 is dissolved in collodion (a solution of nitrocellulose in a volatile liquid such as acetone) instead of pure water, the same effect as above is obtainable.

When tungsten (W) single-crystal <110>, <111> or <310> is used for the electron emitter 2, the same effect as above is obtainable. Moreover, a nitride of Zr, Ti, Y, Sc, V or La, or a solid solution or otherwise a molten mixture containing Zr, Ti, Nb, Y, Sc, V or La and a nitride of the element, may be used as the reservoir 31 whereby the same effect is obtainable in these cases. Further, an oxide of Y, Sc, V or La, or a solid solution or otherwise a molten mixture containing Y, Sc, V or La and an oxide of the element, may be used as the reservoir 3, whereby the same effect is obtainable likewise.

Embodiment 2

Figure 2:
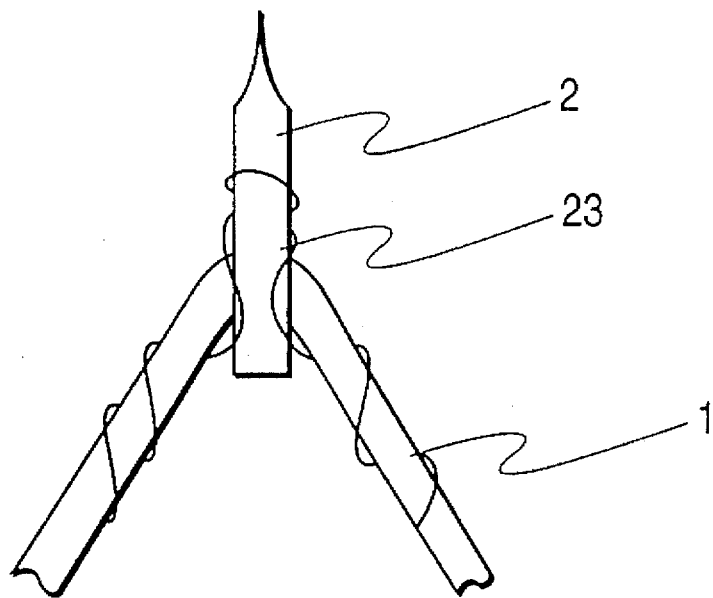
FIG. 2 is a diagram illustrating a cathode according to a second embodiment of the present invention.

FIG. 2 shows a second embodiment of the invention. First, an electron emitter 2 is prepared by spot-welding a W <100> single-crystal having a diameter of 0.127 mm to the bend of a V-shaped tungsten (W) wire heater 1 having a diameter of 0.127 mm, and sharpening the end of the crystal by electrochemical etching in a 5 percent aqueous solution of sodium hydroxide. Then an Nb wire as a reservoir 23 is wound on the joint between a heater 1 and an electron emitter 2, and on the vicinity of the joint. The heater 1 is electrically energized in a high vacuum of a pressure less than $10^{-9}$ Torr, to raise the temperature of the electron emitter 2 up to approximately 2,000° K, so as to thermally diffuse Nb from the reservoir 23 to the point of the electron emitter 2. Further, the temperature of the electron emitter 2 is lowered to approximately 1,500° K, and then nitrogen gas at $10^{-6}$–$10^{-8}$ Torr is introduced to reduce the work function of the W(100) surface of the emitter point by reacting nitrogen with the niobium so as to form a nitride of Nb on the point of the electron emitter 2. When the work function of the W(100) surface is calculated in that state, the function becomes 2.0 eV in value. This value is lower by 0.6 eV than the 2.6 eV resulting from using zirconium oxide as a conventional adsorbate. The distribution of energy of emission electrons obtained by applying an electric field of 0.5 V/nm to the point of the electron emitter 2 was calculated according to the free electron model, whereby FWHM=0.2 eV, and angular intensity=0.5 mA/Sr, were obtained.

When tungsten (W) single-crystal <110>, <111> or <310> is used as the electron emitter 2, the same effect as above is obtainable. Moreover, Y, Sc, V or La may be used as the reservoir 3, whereby the same effect is also obtainable.

In addition, a single metal substance of Y, Sc, V or La may be used. After such metallic atoms are thermally diffused to the surface of the point of the electron emitter 2, oxygen gas at $10^{-6}$–$10^{-8}$ Torr is introduced to create an oxide of the supplied metal on the surface to the point of the electron emitter 2 (e.g., chemically adsorbed on the surface of the point), whereby the same effect as above is obtainable.

Embodiment 3

Figure 3:
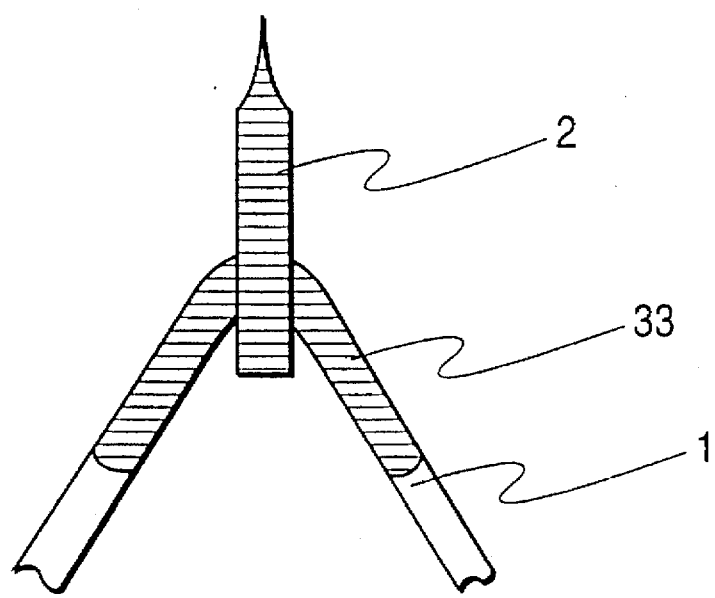
FIG. 3 is a diagram illustrating a cathode according to a third embodiment of the present invention.
Figure 4A:
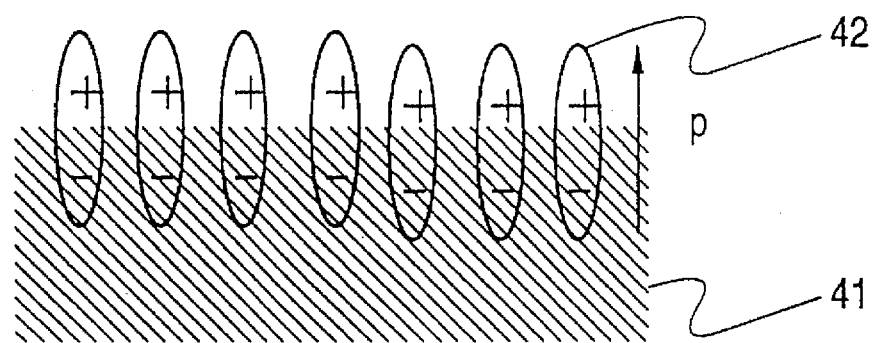
FIGS. 4(a) and (b) are diagrams for illustrating the principle of the cathode according to the present invention.
Figure 4B:
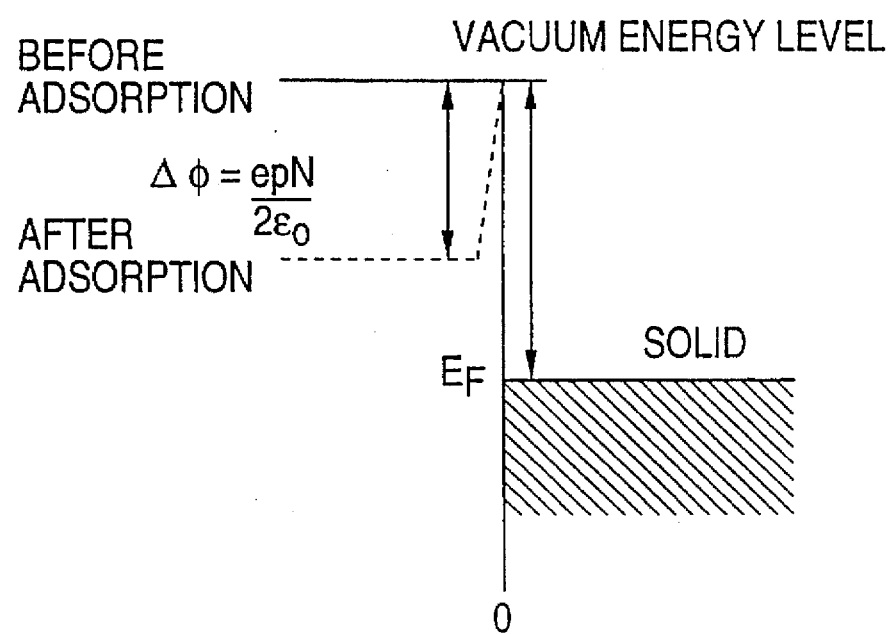

FIG. 3 shows a third embodiment of the invention. First, an electron omitter 2 is prepared by spot-welding a W <100> single-crystal having a diameter of 0.127 mm to the bend of a V-shaped tungsten (W) wire heater 1 having a diameter of 0.127 mm, and sharpening the end of the crystal by electrochemical etching in a 5 percent aqueous solution of sodium hydroxide. Subsequently, a metal evaporation technique is used to deposit a coating 33 of Nb on an area ranging from the vicinity of the joint between the heater 1 and the electron emitter 2 to the point of the electron emitter 2. The coating 33 has a thickness of several atoms. While the point of the electron emitter 2 is heated to approximately 2,000° K, further, nitrogen gas at roughly $10^{-6}$–$10^{-8}$ Torr is introduced so as to reduce the work function of the W(100) surface of the point by depositing a nitride of Nb on the surface of the point of the electron emitter 2. Then the temperature of the electron emitter 2 is lowered to approximately 1,500° K. When the work function of the W(100) surface is calculated in that state, the function becomes 2.0 eV in value. This value is lower by 0.6 eV than the 2.6 eV resulting from using zirconium oxide as a conventional adsorbate. The distribution of energy of emission electrons obtained by applying an electric field of 0.5 V/nm to the point of the electron emitter 2 was calculated according to the free electron model, whereby FWHM=0.2 eV, and angular intensity=0.5 mA/Sr, were obtained.

When tungsten (W) single-crystal <110>, <111> or <310> is used for the electron emitter 2, the same effect as above is obtainable. Moreover, Y, Sc, V or La may be used as the metal material for deposition on the heater 1 and the electron emitter 2, whereby the same effect is obtainable.

In addition, Y, Sc, V or La may be deposited on the heater 1, and the electron emitter 2 is exposed to oxygen gas at $10^{-6}$–$10^{-8}$ Torr to form an oxide coating on the emitter point, whereby the same effect is obtainable.

Embodiment 4

Figure 5:
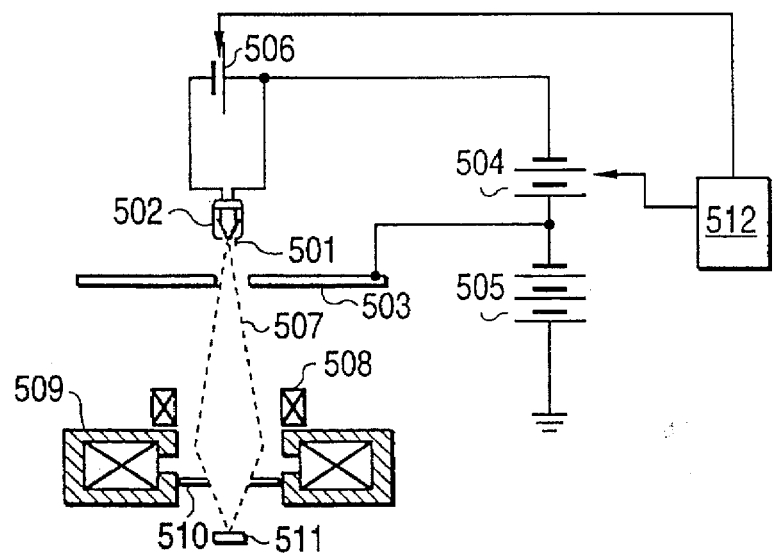
FIG. 5 is an illustrative sectional diagram of an electron beam emission apparatus using a cathode according to the present invention.

FIG. 5 is a block diagram of an exemplary electron beam emission apparatus equipped with a Schottky emission cathode according to Embodiment 1, 2 or 3. As shown in FIG. 5, an anode 503 is provided right under a Schottky emission cathode 501 equipped with a suppressor electrode 502, and an electric field for drawing out electrons is formed between the Schottky emission cathode 501 and the anode 503 by means of a high-tension draw-out power supply 504. The Schottky emission cathode 501 is supplied, by an accelerating power supply 505, with a high negative potential with respect to the ground potential. Moreover, the Schottky emission cathode 501 can be current-heated by a heating power supply 506. The draw-out power supply 504 and the heating power supply 506 are controlled by a control computer 512. The electrons 507 drawn out of the Schottky emission cathode 501 are passed through the probe hole of the anode 503, deflected by a scanning deflection system 508, and converged by a convergence lens 509. The electrons passed through an objective lens 510 are focused on a sample 511.

In the apparatus thus arranged, the value of the work function of the point of the Schottky emission cathode 501, and the values of the desired acceleration voltage and resolving power, are first input to the control computer 512. Based on a proportional relation between resolving power and the ratio of FWHM to accelerating voltage, the control computer 512 determines a draw-out voltage to obtain a desired FWHM according to the free electron model, and sets the output voltage of the draw-out power supply 504 under control. The proportional constant of the relation is determined from a lens, the aberration of a deflector, the current quantity and the required diameter of an electron beam. Thus, an electron beam emission apparatus with a Schottky emission cathode having narrow FWHM and high resolving power is attainable. With the apparatus thus configured as a base, there may be arranged various electron beam application apparatus such as transmission electron microscopes, scanning electron microscopes, electron beam lithography system, etc.

Embodiment 5

Figure 6:
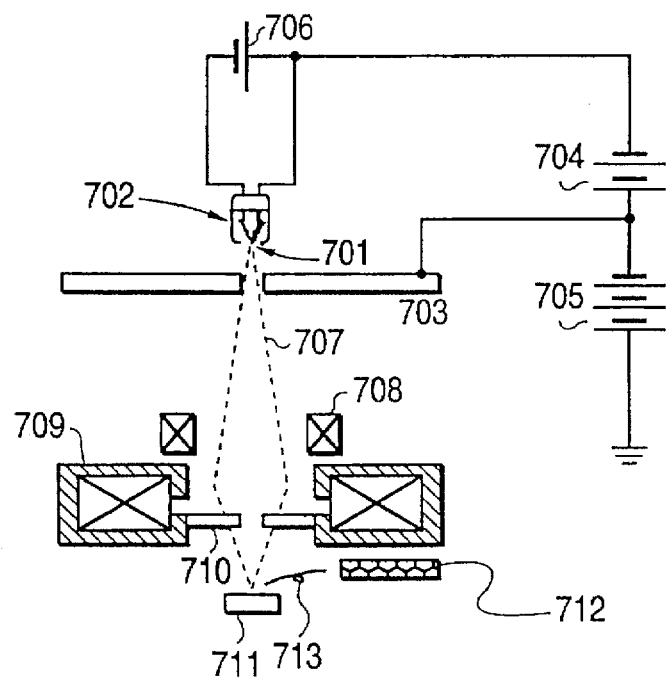
FIG. 6 is an illustrative sectional diagram of another electron beam emission apparatus using a cathode according to the present invention.

FIG. 6 is a block diagram of an exemplary electron beam emission apparatus equipped with a cathode according to Embodiment 1, 2 or 3. As shown in FIG. 6, an anode 703 is provided right under a cathode 701 equipped with a suppressor electrode 702, and an electric field for drawing out electrons is formed between the cathode 701 and the anode 703 by means of a high-tension draw-out power supply 704. The cathode 701 is supplied by an accelerating power supply 705 with a high negative potential with respect to the ground potential. Moreover, the cathode 701 can be current-heated by a heating power supply 706. The electrons 707 drawn out of the cathode 701 are passed through the probe hole of the anode 703, deflected by a scanning deflection system 708, and converged by a convergence lens 709. The electrons passed through an objective lens 710 are focused on a sample 711. A scanning deflection system 708, a convergence lens 709, and an objective lens 710 are what are called an electron optics system, these components 708–710 also forming a radiation system for radiating emitted electrons to the sample. The reflected electrons 713 from a sample 711 are detected by the detector 712.

In the apparatus thus arranged, for example, the sample is a DRAM (Dynamic Random Access Memory). When the electrons 707 were scanned, the detector detected the difference of the signal of reflected electrons 713. Because the electrons 707 had a FWHM of 0.2–0.3 eV, the apparatus could measure the 0.2 μm line width of the electric line of the DRAM by 2% precision. So the resolving power of the apparatus was 4 nm.

As set forth above, a nitride of zirconium (Zr), titanium (Ti), yttrium (Y), niobium (Nb), scandium (Sc), vanadium (V) or lanthanum (La), or an oxide of yttrium (Y), scandium (Sc), vanadium (V) or lanthanum (La), is adsorbed on the surface of the sharp point of the electron emitter formed of tungsten (w) single-crystal <100>, <110>, <111> or <310>, according to the present invention. Therefore, the work function of the crystal face at the point of the electron emitter is reduced. While the point of the electron emitter is being heated, the electric field for drawing out electrons is applied to take out electrons having an energy higher than the potential barrier, and electrons passing through the potential barrier, whereby an electron beam having narrow FWHM and high current density can be obtained. Moreover, the electron emitter according to the present invention is easy to handle.

While we have shown and described several embodiments in accordance with the present invention, it is understood that the present invention is not limited thereto, but is susceptible to numerous changes and modifications as known to one having ordinary skill in the art, and we therefore do not wish to be limited to the details shown and described herein, but intend to cover all such changes and modifications as are encompassed by the scope of the appended claims.

What is claimed is:

1. A cathode comprising a tungsten single-crystal electron emitter with a sharp point, and a heater connected to the electron emitter so as to heat the electron emitter, wherein a nitride of a material which has less electronegativity than nitrogen, and which provides a surface of the electron emitter with a lower work function than that of a tungsten single-crystal, is provided on the heater and is adsorbed on a crystal face of the sharp point of the electron emitter.

2. An electron beam emission apparatus using a cathode comprising a tunasten single-crystal electron emitter with a sharp point, and a heater connected to the electron emitter so as to heat the electron emitter, wherein a nitride of a material which has less electronegativity than nitrogen, and which provides a surface of the electron emitter with a lower work function than that of a tungsten single-crystal, is provided on the heater and is adsorbed on a crystal face of the sharp point of the electron emitter, said electron beam emission apparatus including a device for heating the heater, a device for creating an electric field for drawing electrons out of the cathode, structure for accelerating emission electrons from the cathode, and structure for converging the electrons thus accelerated at a sample to be irradiated therewith.

3. An electron beam emission apparatus as claimed in claim 2, further comprising structure for controlling an intensity of the electric field created by the electric field creating device and used for drawing out electrons, wherein the control structure controls the intensity of the electric field so that electron emission with FWHM necessary for a resolving power to be obtained from the cathode, is obtained.

4. A cathode comprising a tungsten single-crystal electron emitter with a sharp point, and a heater connected to the electron emitter to heat the electron emitter, wherein a layer of a nitride of a metal selected from the group consisting of yttrium, niobium, scandium, vanadium and lanthanum is adsorbed on a crystal face of the point of the electron emitter.

5. A cathode as claimed in claim 4, wherein the electron emitter is formed of tungsten (w) single-crystal having a (100), (110), (111) or (310) orientation.

6. A cathode as claimed in claim 5, wherein a thermal diffusion reservoir of nitride, as a reservoir of nitride to be adsorbed on a crystal face of the point of the electron emitter, is provided on the heater, the thermal diffusion reservoir of nitride including a nitride of a metal selected from the group consisting of yttrium, niobium, scandium, vanadium and lanthanum.

7. A cathode as claimed in claim 6, wherein said thermal diffusion reservoir includes a mixture of said metal and said nitride of said metal.

8. A cathode as claimed in claim 4, wherein a thermal diffusion reservoir of nitride, as a reservoir of nitride to be adsorbed on a crystal face of the point of the electron emitter, is provided on the heater, the thermal diffusion reservoir of nitride including a nitride of a metal selected from the group consisting of yttrium, niobium, scandium, vanadium and lanthanum.

9. A cathode as claimed in claim 8, wherein said thermal diffusion reservoir includes a mixture of said metal and said nitride of said metal.

10. A cathode as claimed in claim 4, wherein a thermal diffusion reservoir of said nitride, to be adhered on the crystal face of the point of the electron emitter, is provided on the cathode.

11. A cathode comprising a tungsten single-crystal electron emitter with a sharp point, and a heater connected to the electron emitter to heat the electron emitter, wherein a thermal diffusion reservoir of material for nitride creation, said nitride to be adsorbed on a crystal face of the point of the electron emitter, is provided on the heater, the thermal diffusion reservoir containing a material selected from the group consisting of yttrium, niobium, scandium, vanadium and lanthanum, wherein a nitride to be adsorbed on the crystal face of the point of the electron emitter is created by reacting the material, supplied to the point of the electron emitter by thermal diffusion, with nitrogen gas.

12. A cathode as claimed in claim 11, wherein the electron emitter is formed of a tungsten single crystal having (100), (110), (111) or (310) orientation.

13. A cathode as claimed in claim 11, wherein said thermal diffusion reservoir is a wire of said material.

14. A cathode as claimed in claim 11, wherein said thermal diffusion reservoir is a reservoir formed by vapor deposition of said material on said heater.

15. A cathode comprising a tungsten single-crystal electron emitter with a sharp point, and a heater connected to the electron emitter to heat the electron emitter, wherein a reservoir of material for nitride creation, said nitride to be adsorbed on a crystal face of the point of the electron emitter, is provided on the electron emitter, the reservoir containing a material selected from the group consisting of yttrium, niobium, scandium, vanadium and lanthanum, the reservoir being formed by evaporation of the material onto the crystal face, the nitride being formed by reacting the material with nitrogen gas.

16. A cathode as claimed in claim 15, wherein said reservoir is also provided on said heater, the material of the reservoir on said heater being supplied to the point of the electron emitter by thermal diffusion.

17. A cathode as claimed in claim 15, wherein the electron emitter is formed of a tungsten single crystal having (100), (110), (111) or (310) orientation.

18. A cathode comprising a tungsten single-crystal electron emitter with a sharp point, the tungsten single crystal having a (100), (110), (111) or (310) orientation, and a heater connected to the electron emitter to heat the electron emitter, wherein a thermal diffusion reservoir of nitride, as a reservoir of nitride to be adsorbed on a crystal face of the point of the electron emitter, is provided on the heater, the thermal diffusion reservoir of nitride including a nitride of a metal selected from the group consisting of zirconium, titanium, yttrium, niobium, scandium, vanadium and lanthanum.

19. A cathode as claimed in claim 18, wherein said thermal diffusion reservoir includes a mixture of said metal and said nitride of said metal.

20. A cathode as claimed in claim 18, wherein said nitride of a metal element selected from the group consisting of zirconium, titanium, yttrium, niobium, scandium, vanadium and lanthanum is adsorbed on the crystal face of the point of the electron emitter.

21. A cathode comprising an electron emitter formed of tungsten single-crystal with a sharp point, and a heater connected to the electron emitter to heat the electron emitter, wherein an oxide of an element selected from the group consisting of yttrium, scandium, vanadium and lanthanum is adsorbed on a crystal face of the point of the electron emitter.

22. A cathode as claimed in claim 21, wherein the electron emitter is formed of tungsten single crystal having a (100), (110), (111) or (310) orientation.

23. An electron beam emission apparatus using a cathode, comprising the cathode as claimed in claim 22, a device for heating the heater, a device for creating an electric field for drawing electrons out of the cathode, structure for accelerating emission electrons from the cathode, and structure for converging the electrons thus accelerated at a sample to be irradiated therewith.

24. An electron beam emission apparatus as claimed in claim 23, further comprising structure for controlling an intensity of the electric field created by the electric field creating device and used for drawing out electrons, wherein the control structure controls the intensity of the electric field so that electron emission with FWHM necessary for a resolving power to be obtained from the cathode, is obtained.

25. A cathode as claimed in claim 22, wherein a thermal diffusion reservoir of oxide, as a reservoir of oxide to be adsorbed on the crystal face of the point of the electron emitter, is provided on the heater, the thermal diffusion reservoir of oxide including an oxide of a metal selected from the group consisting of yttrium, scandium, vanadium and lanthanum.

26. A cathode as claimed in claim 25, wherein said thermal diffusion reservoir includes a mixture of said metal and said oxide of said metal.

27. A cathode as claimed in claim 22, wherein a thermal diffusion reservoir of material for oxide creation, as a reservoir of oxide to be adsorbed on the crystal face of the point of the electron emitter, is provided on the heater, the thermal diffusion reservoir containing a metal selected from the group consisting of yttrium, scandium, vanadium and lanthanum, wherein an oxide to be adsorbed on the crystal face of the point of the electron emitter is formed by reacting the material, supplied to the point of the electron emitter by means of thermal diffusion, with oxygen gas.

28. A cathode as claimed in claim 22, wherein an oxide to be adsorbed on the crystal face of the point of the electron emitter is created through oxidation by depositing a material selected from the group consisting of yttrium, scandium, vanadium and lanthanum by evaporation onto the crystal face of the point of the electron emitter, and reacting the material deposited with oxygen gas.

29. A cathode as claimed in claim 21, wherein a thermal diffusion reservoir of oxide, as a reservoir of oxide to be adsorbed on the crystal face of the point of the electron emitter, is provided on the heater, the thermal diffusion reservoir of oxide including an oxide of a metal selected from the group consisting of yttrium, scandium, vanadium and lanthanum.

30. A cathode as claimed in claim 29, wherein the thermal diffusion reservoir includes a mixture of said oxide and said metal.

31. A cathode as claimed in claim 21, wherein a thermal diffusion reservoir of material for oxide creation, as a reservoir of oxide to be adsorbed on the crystal face of the point of the electron emitter, is provided on the heater, the thermal diffusion reservoir containing said element, wherein the oxide adsorbed on the crystal face of the point of the electron emitter is formed by reacting the material, supplied to the point of the electron emitter by means of thermal diffusion, with oxygen gas.

32. A cathode as claimed in claim 21, wherein an oxide to be adsorbed on the crystal face of the point of the electron emitter is created through oxidation by depositing a material selected from the group consisting of yttrium, scandium, vanadium and lanthanum by evaporation onto the crystal face of the point of the electron emitter, and reacting the material deposited with oxygen gas.

33. An electron beam emission apparatus using a cathode, comprising the cathode as claimed in claim 21, a device for heating the heater, a device for creating an electric field for drawing electrons out of the cathode, structure for accelerating emission electrons from the cathode, and structure for converging the electrons thus accelerated at a sample to be irradiated therewith.

34. An electron beam emission apparatus as claimed in claim 33, further comprising structure for controlling intensity of the electric field created by the electric field creating device and used for drawing out electrons, wherein the control structure controls the intensity of the electric field so as to obtain electron emission with FWHM necessary for a resolving power.

35. A cathode comprising a tungsten single-crystal electron emitter with a sharp point, and a heater connected to the electron emitter to heat the electron emitter, wherein a reservoir of a nitride of an element selected from the group consisting of zirconium, titanium, yttrium, niobium, scandium, vanadium and lanthanum, or an oxide of an element selected from the group consisting of yttrium, scandium, vanadium and lanthanum, is provided on the heater.

36. A cathode as claimed in claim 35, wherein the nitride or oxide is provided such that it can thermally diffuse so as to be adsorbed on a crystal face of the point of the electron emitter.

37. A cathode comprising a tungsten single-crystal electron emitter with a sharp point, and a heater connected to the electron emitter to heat the electron emitter, wherein a nitride of an element selected from the group consisting of zirconium, titanium, yttrium, niobium, scandium, vanadium and lanthanum, or an oxide of an element selected from the group consisting of yttrium, scandium, vanadium and lanthanum, is adsorbed on a crystal face of the sharp point of the electron emitter, and a thermal diffusion reservoir of said nitride or said oxide adsorbed on the crystal face of the sharp point, to be adsorbed on the crystal face of the sharp point, is provided on the heater.

38. An electron beam emission apparatus for measuring the size of a sample by detection of a reacting signal from the sample, comprising:
a cathode having a tungsten single-crystal electron emitter with a sharp point, the electron emitter being connected to a heater, wherein a nitride or an oxide, lowering a work function of the electron emitter as compared to a work function of the tungsten single-crystal, is provided on the heater and is adsorbed on crystal faces of the sharp point of the electron emitter; and
an electron optics system for controlling electrons emitted from the electron emitter, said electron optics system converging the electrons, said electron optics system including a radiation system for radiating converged electrons to the sample, the electron optics system providing a resolving power, of a signal, of 1–5 nm.

39. An electron beam emission apparatus as claimed in claim 38, wherein said nitride is provided on said heater and adsorbed on crystal faces of the sharp point, said nitride being a nitride of a metal selected from the group consisting of zirconium, titanium, yttrium, niobium, scandium, vanadium and lanthanum.

40. An electron beam emission apparatus as claimed in claim 39, wherein said nitride is a nitride of a metal selected from the group consisting of yttrium, niobium, scandium, vanadium and lanthanum.

41. An electron beam emission apparatus as claimed in claim 38, wherein said oxide is provided on said heater and adsorbed on crystal faces of the sharp point, said oxide being an oxide of a metal selected from the group consisting of yttrium, scandium, vanadium and lanthanum.

42. An electron beam emission apparatus, comprising:
a cathode having a tungsten single-crystal electron emitter with a sharp point, the electron emitter being connected to a heater, with a layer of a nitride of an element selected from the group consisting of yttrium, niobium, scandium, vanadium and lanthanum, or a layer of an oxide of an element selected from the group consisting of yttrium, scandium, vanadium and lanthanum, being adsorbed on a crystal face of the point of the electron emitter;
an anode adjacent said cathode;
a voltage generating device to apply a voltage between the cathode and the anode, to draw out electrons from the cathode;
an electron optics system for focusing the electrons on a sample; and
a sample holder, for holding the sample.

43. An electron beam emission apparatus as claimed in claim 42, wherein the electron optics system includes a convergence lens and an objective lens.

44. An electron beam emission apparatus as claimed in claim 42, further comprising a scanning deflection system for scanning the sample.

45. An electron beam emission apparatus as claimed in claim 42, wherein the apparatus is a scanning electron microscope.

46. An electron beam emission apparatus as claimed in claim 42, wherein a thermal diffusion reservoir of said nitride or said oxide, to be adsorbed on the crystal face of the point of the electron emitter, is provided on the cathode.

* * * * *